(12) United States Patent
Kim

(10) Patent No.: US 9,418,725 B2
(45) Date of Patent: Aug. 16, 2016

(54) SEMICONDUCTOR DEVICE AND METHOD OF DRIVING THE SAME

(71) Applicant: SK hynix Inc., Gyeonggi-do (KR)

(72) Inventor: Bo-Yeun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/680,774

(22) Filed: Apr. 7, 2015

(65) Prior Publication Data

US 2016/0133311 A1    May 12, 2016

(30) Foreign Application Priority Data

Nov. 10, 2014  (KR) .......................... 10-2014-0155511

(51) Int. Cl.
*G11C 7/00* (2006.01)
*G11C 11/4093* (2006.01)
*G11C 11/408* (2006.01)

(52) U.S. Cl.
CPC .......... *G11C 11/4093* (2013.01); *G11C 11/408* (2013.01)

(58) Field of Classification Search
CPC .... G11C 13/004; G11C 13/0069; G11C 7/22; G11C 13/0004; G11C 11/161; G11C 11/4096; G11C 11/419; G11C 13/0097; G11C 7/106; G11C 11/408; G11C 16/26; G11C 7/10; G11C 7/12; G11C 11/406

USPC ................. 365/189.01, 51, 185.11, 189.02, 365/230.03, 230.01, 185.12
See application file for complete search history.

(56) References Cited

U.S. PATENT DOCUMENTS

2008/0062772 A1 * 3/2008 Ko ....................... G11C 7/1012
365/189.02

FOREIGN PATENT DOCUMENTS

KR    1020090047993    5/2009

* cited by examiner

*Primary Examiner* — Thong Q Le
(74) *Attorney, Agent, or Firm* — IP & T Group LLP

(57) ABSTRACT

A semiconductor device may include a common coupling block suitable for coupling a plurality of first data lines to a plurality of second data lines in response to a common control signal, which is activated regardless of a data bandwidth option mode, a first coupling block suitable for coupling a part of the plurality of second data lines to a part of a plurality of third data lines in response to a first operation control signal, a second coupling block suitable for coupling the other part of the plurality of second data lines to the other part of the plurality of third data lines in response to a second operation control signal, and a control block suitable for activating one or more of the first and second operation control signals based on the data bandwidth option mode, during a data input/output operation.

20 Claims, 4 Drawing Sheets

| OPERATION MODE | X4 | AY11 | IOSW03 | IOSW47 |
|---|---|---|---|---|
| X4 mode | H | L | H | L |
|  |  | H | L | H |
| X8 mode | L | L | H | H |
|  |  | H | H | H |

SEMICONDUCTOR DEVICE AND METHOD OF DRIVING THE SAME

CROSS-REFERENCE TO RELATED APPLICATIONS

The present application claims priority of Korean Patent Application No. 10-2014-0155511, filed on Nov. 10, 2014, which is incorporated herein by reference in its entirety.

BACKGROUND

1. Field

Exemplary embodiments of the present invention relate to a semiconductor design technology and, more particularly, to a semiconductor device which supports various option modes of data bandwidth and a method of driving the same.

2. Description of the Related Art

As the integration degree of semiconductor devices, such as DDR SDRAM (Double Data Rate Synchronous DRAM) is increased with the development of process technology, tens of millions of memory cells are provided in a single semiconductor device.

Such semiconductor devices are designed to operate according to data bandwidth options. Data bandwidth options are set to output a set bandwidth of data, and are defined specifications. For example, in a semiconductor device with eight data input/output pads, data input/output operations are performed through all eight data input/output pads when the data bandwidth option is set to X8 mode, or it is performed through only four of the data input/output pads when the data bandwidth option is set to X4 mode.

FIG. 1 is a diagram for explaining an operation of a conventional semiconductor device. FIG. 1 illustrates an operation based on the X4 mode.

Referring to FIG. 1, an active operation ACT1 is first performed. When the active operation ACT1 is performed, a predetermined word line is enabled to load first to eighth write data stored in first to eighth memory cells (hereafter, referred to as "first to eighth pre-write data") into first to eighth bit lines, while charge sharing occurs between the first to eight memory cells and the first to eighth bit lines. Then, an amplification block amplifies the first to eighth pre-write data loaded in the first to eighth bit lines. For example, the amplification block amplifies a voltage difference between first pre-write data loaded in a first bit line BL0 and first inverted pre-write data loaded in a first bit line bar BLB0.

In such a state, a first write operation WT1 is performed.

A write driving block transmits first to fourth write data inputted through first to fourth input/output pads DQ0 to DQ3 to first to fourth local lines based on the X4 mode. For example, the write driving block may include first and second write driving units, and the first write driving unit transmits the first to fourth write data to the first to fourth local lines, while the second write driving unit is disabled.

A second common coupling block transmits the first to fourth write data loaded in the first to fourth local lines to first to fourth segment lines SIO0 to SIO3 according to a switching control signal IOSW. For reference, the second common coupling block may include ninth to 16th switching units, which are turned on according to the switching control signal IOSW, and the first to fourth write data are transmitted through the ninth to 12th switching units among the ninth to 16th switching units.

A first common coupling block transmits the first to fourth write data loaded in the first to fourth segment lines SIO0 to SIO3 to the first to fourth bit lines according to a column select signal YI. For reference, the first common coupling block may include first to eighth switching units, which are turned on according to the column select signal YI, and the first to fourth write data are transmitted through the first to fourth switching units among the first to eighth switching units.

At this time, the first to fourth pre-write data loaded in the first to fourth bit lines are changed to the first to fourth write data, and the fifth to eighth pre-write data loaded in the fifth to eighth bit lines are retained as they are.

A memory block stores the first to fourth write data loaded in the first to fourth bit lines, and stores the fifth to eighth pre-write data loaded in the fifth to eighth bit lines.

Then, a second write operation WT2 is performed.

The write driving block transmits the fifth to eighth write data inputted through fifth to eighth input/output pads (not illustrated) to fifth to eighth local lines based on the X4 mode. For example, the second write driving unit transmits the fifth to eighth write data to the fifth to eighth local lines. The first write driving unit is disabled.

The second common coupling block transmits the fifth to eighth write data loaded in the fifth to eighth local lines to fifth to eighth segment lines according to the switching control signal IOSW. For reference, all of the ninth to 16th switching units SW10 to SW17 are turned on according to the switching control signal IOSW, and the fifth to eighth write data are transmitted through the 13th to 16th switching units among the ninth to 16th switching units.

The first common coupling block transmits the fifth to eighth write data loaded in the fifth to eighth segment lines to the fifth to eighth bit lines according to the column select signal YI. For reference, all of the first to eighth switching units are turned on according to the column select signal YI, and the fifth to eighth write data are transmitted through the fifth to eighth switching units among the first to eighth switching units.

At this time, the fifth to eighth pre-write data that is loaded in the fifth to eighth bit lines are changed into the fifth to eighth write data, and the first to fourth write data that is loaded in the first to fourth bit lines are retained as they are.

The memory block stores the first to fourth write data that is loaded in the first to fourth bit lines, and stores the fifth to eighth write data that is loaded in the fifth to eighth bit lines.

As described above, when the fifth to eighth pre-write data that is loaded in the fifth to eighth bit lines are changed to the fifth to eighth write data, the first to fourth write data that is loaded in the first to fourth bit lines are to be retained as they are.

Referring to FIG. 1, however, while the second write operation WT2 is performed, the first to fourth write data are not retained as they are, but changed to other data. This is because, when the fifth to eighth switching units and the 13th to 16th switching units for transmitting the fifth to eighth write data are turned on, the first to fourth switching units and the ninth to 12th switching units are turned on together. In other words, since the first to fourth local lines and the first to fourth segment lines are electrically coupled to the first to fourth bit lines, in a state where the first write driving unit is disabled, charge sharing occurs between the first to fourth write data, loaded in the first to fourth bit lines, and electric charges remaining in the first to fourth segment lines and the first to fourth local lines. The first to fourth write data are unexpectedly changed. For reference, since the first to fourth local lines are longer than the first to fourth segment lines, parasitic capacitance of the first to fourth local lines is greater than the parasitic capacitance of the first to fourth segment lines. Due to the parasitic capacitances of the first to fourth segment lines and the parasitic capacitances of the first to fourth local lines, the charge sharing value may be increased.

When the first to fourth write data are unexpectedly changed, as described above, the next read operation RD1 may fail. This failure is referred to as X4 flipping error.

SUMMARY

Various embodiments are directed to a semiconductor device capable of preventing X4 flipping errors and a method of driving the same.

In an embodiment, a semiconductor device may include a common coupling block suitable for coupling a plurality of first data lines to a plurality of second data lines in response to a common control signal which is activated regardless of a data bandwidth option mode, a first coupling block suitable for coupling a part of the plurality of second data lines to a part of a plurality of third data lines in response to a first operation control signal, a second coupling block suitable for coupling the other part of the plurality of second data lines to the other part of the plurality of third data lines in response to a second operation control signal, and a control block suitable for activating one or more of the first and second operation control signals based on the data bandwidth option mode, during a data input/output operation.

In an embodiment, a semiconductor device may include a memory block, a plurality of bit lines coupled to the memory block, a plurality of segment lines coupled one-to-one to the plurality of bit lines, a common coupling block suitable for coupling the plurality of bit lines to the plurality of segment lines at the same time in response to a column select signal, a plurality of local lines coupled one-to-one to the plurality of segment lines, a first coupling block suitable for coupling a part of the plurality of segment lines to a part of the plurality of local lines at the same time in response to a first operation control signal, a second coupling block suitable for coupling the other part of the plurality of segment lines to the other part of the plurality of local lines at the same time in response to a second operation control signal, a data driving block coupled to the plurality of local lines, and a control block suitable for activating one or more of the first and second operation control signals based on a data bandwidth option signal, during a column operation.

In an embodiment, a method of driving a semiconductor device may include setting a first bandwidth option mode corresponding to a data bandwidth having a lower level than a maximum data bandwidth among a plurality of data bandwidth option modes supported by the semiconductor device, and sequentially performing first and second write operations based on the first data bandwidth option mode, when a first active operation is performed, wherein the performing of the first and second write operations each comprises connecting write paths through which data having the lower level data bandwidth are transmitted based on the first bandwidth option mode, among a plurality of write paths corresponding to the maximum data bandwidth, and disconnecting the other write paths among the plurality of write paths.

DETAILED DESCRIPTION

Figure 1:
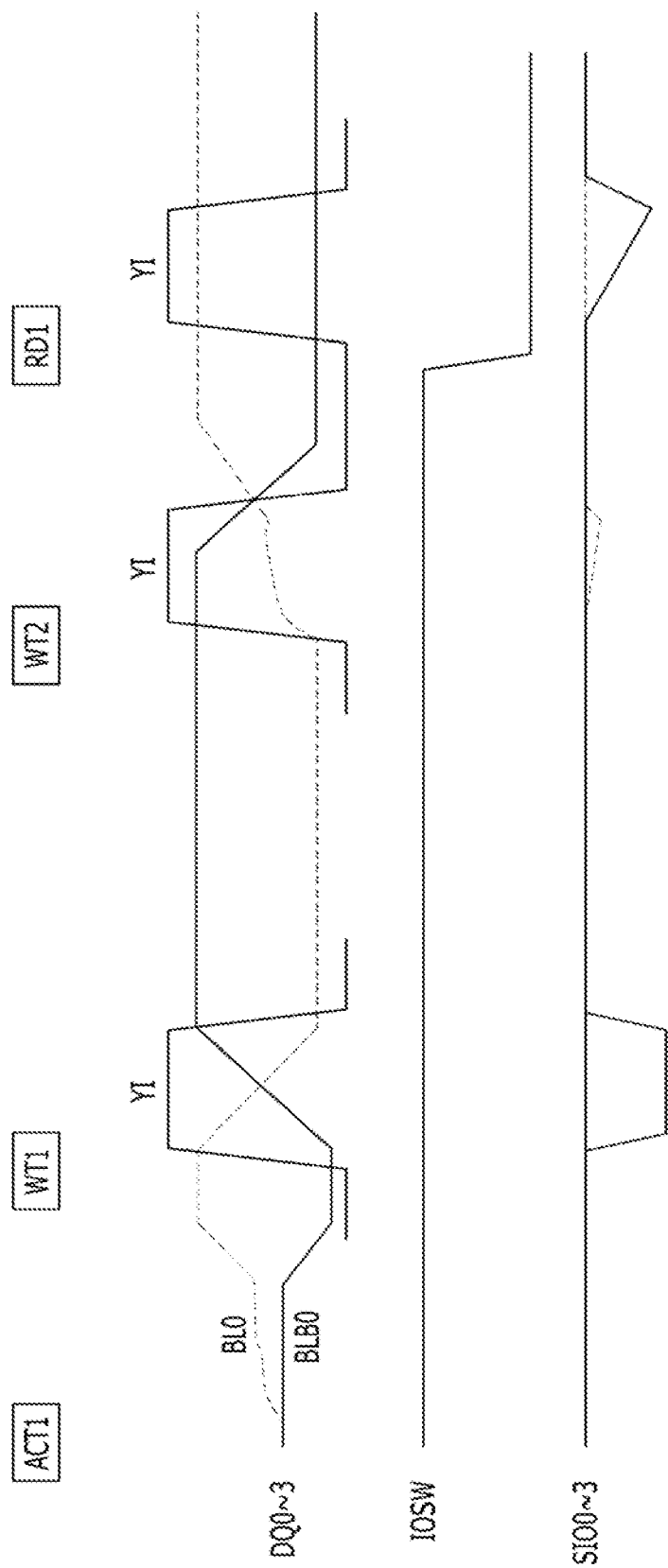
FIG. 1 is a diagram for explaining an operation of a conventional semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements, if there is no specific limitation. The terms of a singular form may include plural forms unless referred to the contrary.

In the following descriptions for embodiments of the present invention, "X8 mode" will be described as an example of an option mode for the maximum data bandwidth, and "X4 mode" will be described as an example of an option mode having a lower level than the X8 mode.

Figure 2:
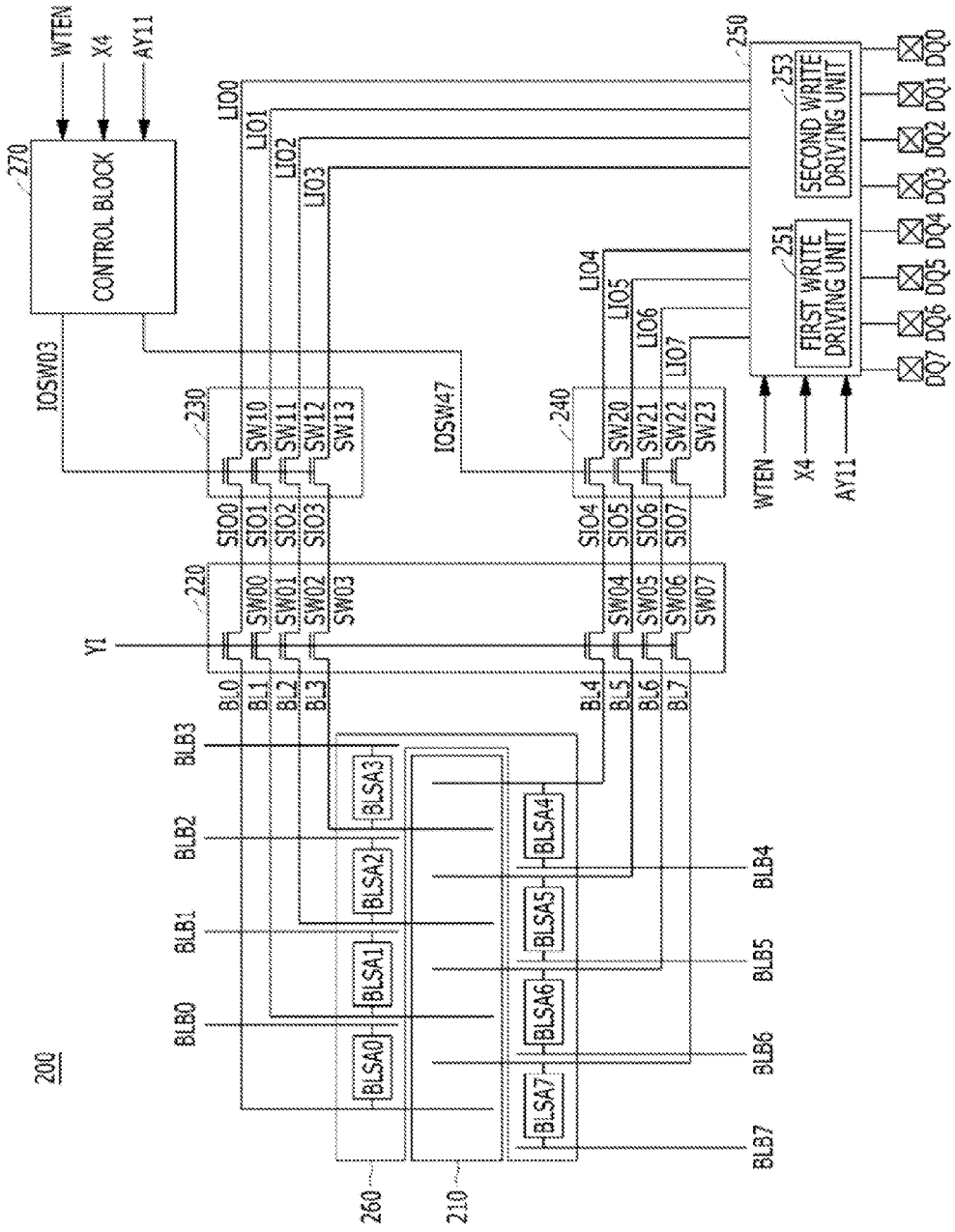
FIG. 2 is a configuration diagram of a semiconductor device in accordance with an embodiment of the present invention.

FIG. 2 is a configuration diagram of a semiconductor device in accordance with an embodiment of the present invention.

Referring to FIG. 2, the semiconductor device 200 may include a memory block 210, first to eighth bit lines BL0 to BL7, first to eighth segment lines SIO0 to SIO7, a common coupling block 220, first to eight local lines LIO0 to LIO7, a first coupling block 230, a second coupling block 240, a write driving block 250, an amplification block 260, and a control block 270. The memory block 210 may include a plurality of memory cells (not illustrated). The first to eighth bit lines BL0 to BL7 may be coupled to the memory block 210. The first to eighth segment lines SIO0 to SIO7 may be provided to correspond to the first to eighth bit lines BL0 to BL7. The common coupling block 220 may couple the first to eighth bit lines BL0 to BL7 to the first to eighth segment lines SIO0 to SIO7 at the same time in response to a column select signal YI. The first to eighth local lines LIO0 to LIO7 may be provided to correspond to the first to eighth segment lines SIO0 to SIO7. The first coupling block 230 may couple the first to fourth segment lines SIO0 to SIO3 to the first to fourth local lines LIO0 to LIO3 at the same time in response to a first switching control signal IOSWO3. The second coupling block 240 may couple the fifth to eighth segment lines SIO4 to SIO7 to the fifth to eighth local lines LIO4 to LIO7 at the same time in response to a second switching control signal IOSW47. The write driving block 250 may transmit first to eighth write data inputted through first to eighth input/output pads DQ0 to DQ7 to the first to eighth local lines LIO0 to LIO7. The amplification block 260 may amplify the first to eighth write data loaded in the first to eighth bit lines BL0 to BL7. The control block 270 may generate the first and second switching control signals IOSW03 and IOSW47.

The memory block 210 may store write data loaded in a part or all of the first to eighth bit lines BL0 to BL7 during a write operation. For example, the memory block 110 may store the first to fourth write data loaded in the first to fourth bit lines BL0 to BL3 or store the fifth to eighth write data loaded in the fifth to eighth bit lines BL4 to BL7, during the X4 mode. Furthermore, the memory block 110 may store the first to eighth write data loaded in the first to eighth bit lines BL0 to BL7 during the X8 mode.

The common coupling block 220 may include first to eighth switching units SWO0 to SWO7 for coupling the first to eighth bit lines BL0 to BL7 to the first to eighth segment lines SIO0 to SIO7, respectively. The first to eighth switching units SW00 to SW07 may be commonly controlled based on the column select signal VI. In other words, the first to eighth switching units SW00 to SW07 may be simultaneously switched in response to the column select signal VI, regardless of the data bandwidth option mode (X4 mode or X8 mode).

The first coupling block 230 may include ninth to 12th switching units SW10 to SW13 for coupling the first to fourth segment lines SIO0 to SIO3 to the first to fourth local lines LIO0 to LIO3, respectively. The ninth to 12th switching units SW10 to SW13 may be commonly controlled based on the first switching control signal IOSW03. In other words, the ninth to 12th switching units SW10 to SW13 may be simultaneously turned on or off in response to the first switching control signal IOSW03 based on the data bandwidth option mode (X4 mode or X8 mode).

The second coupling block 240 may include 13th to 16th switching units SW20 to SW23 for coupling the fifth to eighth segment lines SIO4 to SIO7 to the fifth to eighth local lines LIO4 to LIO7, respectively. The 13th to 16th switching units SW20 to SW23 may be commonly controlled based on the second switching control signal IOSW47. In other words, the 13th to 16th switching units SW20 to SW23 may be simultaneously turned on or off in response to the second switching control signal IOSW47 based on the data bandwidth option mode (X4 mode or X8 mode).

The write driving block 250 may include a first write driving unit 251 and a second write driving unit 253. The first write driving unit 251 may transmit the first to fourth write data inputted through first to fourth input/output pads DQ0 to DQ3 to the first to fourth local lines LIO0 to LIO3, and the second write driving unit 253 may transmit the fifth to eighth write data inputted through fifth to eighth input/output pads DQ4 to DQ7 to the fifth to eighth local lines LIO4 to LIO7.

The first and second write driving units 251 and 253 may be selectively enabled based on the data bandwidth option mode (X4 mode or X8 mode). For example, only one of the first and second write driving units 251 and 253 may be enabled based on a specific address signal AY11 during the X4 mode, and both of the first and second write driving units 251 and 253 may be enabled regardless of the specific address signal AY11 during the X8 mode.

The amplification block 260 may include first to eighth bit line amplification units BLSA0 to BLSA7 corresponding to the first to eighth bit lines BL0 to BL7. The first to eighth bit line amplification units BLSA0 to BLSA7 may amplify the first to eighth write data loaded in the first to eighth bit lines BL0 to BL7. For example, the first bit line amplification unit BLSA0 may amplify a voltage difference between the first write, data loaded in the first bit line BL0 and first inverted write data, loaded in a first bit line bar BLB0.

Figures 3, 4:
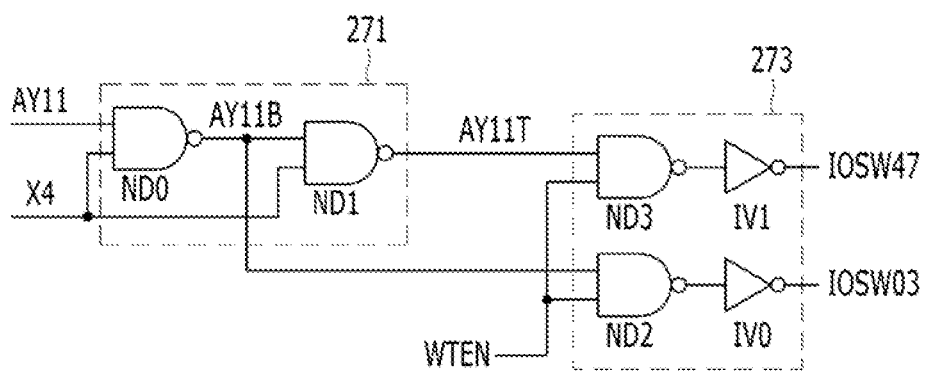
FIG. 3 is an internal configuration diagram illustrating an example of a control block of FIG. 2.
FIG. 4 illustrates a table for explaining the input/output relationship of a control block of FIG. 3.

FIG. 3 is an internal configuration diagram illustrating an example of the control block 270 of FIG. 2.

Referring to FIG. 3, the control block 270 may include a first logic unit 271 and a second logic unit 273. The first logic unit 271 may generate first and second control signals AY11B and AY11T in response to the specific address signal AY11 and a data bandwidth option signal X4, and the second logic unit 273 may generate the first and second switching control signals IOSW03 and IOSW47 in response to the first and second control signals AY11B and AY11T and a write enable signal WTEN.

For example, the first logic unit 271 may include a first NAND gate ND0 and a second NAND gate ND1. The first NAND gate ND0 may perform a NAND operation on the specific address signal AY11 and the data bandwidth option signal X4 and generate the first control signal AY11B, and the second NAND gate ND1 may perform a NAND operation on the first control signal AY11B and the data bandwidth option signal X4 and generate the second control signal AY11T.

The second logic unit 273 may include a third NAND gate ND2, a first inverter IV0, a fourth NAND gate ND3, and a second inverter IV1. The third NAND gate ND2 may perform a NAND operation on the first control signal AY11B and the write enable signal WTEN. The first inverter IV0 may invert an output signal of the third NAND gate ND2 and generate the first switching control signal IOSW03. The fourth NAND gate ND3 may perform a NAND operation on the second control signal AY11T and the write enable signal WTEN. The second inverter IV1 may invert an output signal of the fourth NAND gate ND3 and generate the second switching control signal IOSW47.

FIG. 4 illustrates a table for explaining the input/output relationship of the control block 270. In FIG. 4, it is described as an example that the write enable signal WTEN is activated to a logic high level H.

Referring to FIG. 4, the data bandwidth option signal X4 may be activated to a logic high level H in the X4 mode, and deactivated to a logic low level L in the X8 mode.

During the X4 mode, whether to activate the first and second switching control signals IOSW03 and IOSW47 may be determined based on the specific address signal AY11. For example, when the specific address signal AY11 is at the logic low level L, the first switching control signal IOSW03 may be activated to the logic high level H, and the second switching control signal IOSW47 may be deactivated to the logic low level L. On the other hand, when the specific address signal AY11 is at the logic high level H, the first switching control signal IOSW03 may be deactivated to the logic low level L, and the second switching control signal IOSW47 may be activated to the logic high level H.

During the X8 mode, both of the first and second switching control signals IOSW03 and IOSW47 may be activated regardless of the specific address signal AY11.

Hereafter, a method of driving the semiconductor device 200 in accordance with the embodiment of the present invention will be described.

Figure 5:
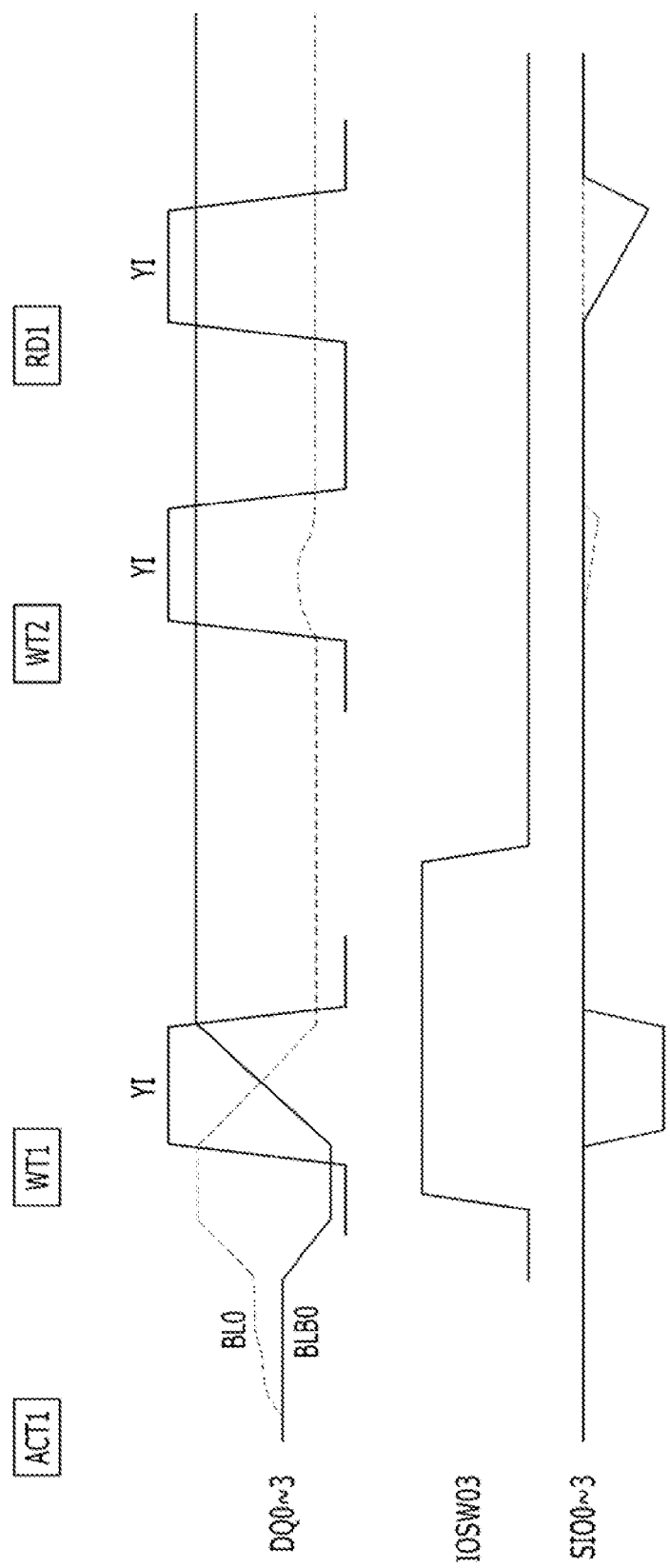
FIG. 5 is a diagram for explaining the method of driving the semiconductor device in accordance with an embodiment of the present invention.

FIG. 5 is a diagram for explaining the method of driving the semiconductor device in accordance with the embodiment of the present invention. FIG. 5 illustrates an operation based on the X4 mode.

Referring to FIG. 5, a first active operation ACT1 is performed. When the active operation ACT1 is performed, a predetermined word line (not illustrated) may be enabled to load first to eighth write data stored in first to eighth memory cells (hereafter, referred to as "first to eighth pre-write data") into the first to eighth bit lines BL0 to BL7, as charge sharing occurs between the first to eight memory cells and the first to eighth bit lines BL0 to BL7. Then, the amplification block 260 may amplify the first to eighth pre-write data loaded in the first to eighth bit lines BL0 to BL7. For example, the first bit line amplification unit BLSA0 may amplify a voltage difference between the first pre-write data loaded in the first bit line BL0 and the first inverted pre-write data loaded in the first bit line bar BLB0.

In this state, the first write operation WT1 may be performed.

The write driving block 250 may transmit the first to fourth write data inputted through the first to fourth input/output pads DQ0 to DQ3 to the first to fourth local lines LIO0 to LIO3 based on the X4 mode. For example, the first write driving unit 251 may be enabled based on the write enable signal WTEN, the data bandwidth option signal X4, and the specific address signal AY11, and transmit the first to fourth write data to the first to fourth local lines LIO0 to LIO3. At this time, the second write driving unit 253 may be disabled based on the write enable signal WTEN, the data bandwidth option signal X4, and the specific address signal AY11.

The first coupling block 230 may transmit the first to fourth write data loaded in the first to fourth local lines LIO0 to LIO3 to the first to fourth segment lines SIO0 to SIO3 based on the first switching control signal IOSW03. For example, all of the ninth to 12th switching units SW10 to SW13 may be turned on in response to the first switching control signal IOSW03.

The second coupling block 240 may be disabled based on the second switching control signal IOSW47. For example, all of the 13th to 16th switching units SW20 to SW23 may be turned off in response to the second switching control signal IOSW47. In this case, the fifth to eighth segment lines SIO4 to SIO7 and the fifth to eighth local lines LIO4 to LIO7 may be electrically disconnected from each other by the 13th to 16th switching units SW20 to SW23, respectively.

Continuously, the common coupling block 220 may transmit the first to fourth write data loaded in the first to fourth segment lines SIO0 to SIO3 to the first to fourth bit lines BL0 to BL3 based on the column select signal YI. For example, all of the first to eighth switching units SW00 to SW07 may be turned on based on the column select signal YI, and the first to fourth write data may be transmitted through the first to fourth switching units SW00 to SW03 among the first to eighth switching units SW00 to SW07.

Then, the first to fourth pre-write data loaded in the first to fourth bit lines BL0 to BL3 may be changed into the first to fourth write data transmitted through the first to fourth switching units SW00 to SW03, and the fifth to eighth pre-write data loaded in the fifth to eighth bit lines BL4 to BL7 may be retained as they are.

Then, the memory block 210 may store the first to fourth write data loaded in the first to fourth bit lines BL0 to BL3 and store the fifth to eighth pre-write data loaded in the fifth to eighth bit lines BL4 to BL7.

Then, a second write operation WT2 may be performed.

The write driving block 250 may transmit the fifth to eighth write data inputted through the fifth to eighth input/output pads DQ4 to DQ7 to the fifth to eighth local lines LIO4 to LIO7 based on the X4 mode. For example, the second write driving unit 253 may be enabled based on the write enable signal WTEN, the data bandwidth option signal X4, and the specific address signal AY11, and transmit the fifth to eighth write data to the fifth to eighth local lines LIO4 to LIO7. At this time, the first write driving unit 251 may be disabled based on the write enable signal WTEN, the data bandwidth option signal X4, and the specific address signal AY11.

The second coupling block 240 may transmit the fifth to eighth write data loaded in the fifth to eighth local lines LIO4 to LIO7 to the fifth to eighth segment lines SIO4 to SIO7 based on the second switching control signal IOSW47. For example, all of the 13th to 16th switching units SW20 to SW23 may be turned on in response to the second switching control signal IOSW47.

The first coupling block 230 may be disabled based on the first switching control signal IOSW03. For example, all of the ninth to 12th switching units SW10 to SW13 may be turned off in response to the first switching control signal IOSW03. In this case, the first to fourth segment lines SIO0 to SIO3 and the first to fourth local lines LIO0 to LIO3 may be electrically disconnected from each other by the ninth to 12th switching units SW10 to SW13, respectively.

Continuously, the common coupling block 220 may transmit the fifth to eighth write data loaded in the fifth to eighth segment lines SIO4 to SIO7 to the fifth to eighth bit lines BL4 to BL7 based on the column select signal YI. For example, all of the first to eighth switching units SW00 to SW07 may be turned on based on the column select signal YI, and the fifth to eighth write data may be transmitted through the fifth to eighth switching units SW04 to SW07 among the first to eighth switching units SW00 to SW07.

At this time, since the first to fourth switching units SW00 to SW03 are turned on, the first to fourth bit lines BL0 to BL3 and the first to fourth segment lines SIO0 to SIO3 may be electrically coupled to each other. Furthermore, since the ninth to 12th switching units SW10 to SW13 are turned off, the first to fourth segment lines SIO0 to SIO3 and the first to fourth local lines LIO0 to LIO3 may be electrically disconnected from each other. Thus, since the first to fourth bit lines BL0 to BL3 are not influenced by parasitic capacitors of the first to fourth local lines LIO0 to LIO3, the first to fourth write data loaded in the first to fourth bit, lines BL0 to BL3 may not be changed by electric charges remaining in the first to fourth local lines LIO0 to LIO3. That is, charge sharing does not occur between the first to fourth bit lines BL0 to BL3 and the first to fourth local lines LIO0 to LIO3. For reference, although charge sharing occurs between the first to fourth bit lines BL0 to BL3 and the first to fourth segment lines SIO0 to SIO3, electrical charges remaining in the first to fourth segment lines SIO0 to SIO3 may be ignored in comparison to the electrical charges remaining in the first to fourth local lines LIO0 to LIO3.

Continuously, the first to eighth pre-write data loaded in the fifth to eighth bit lines BL4 to BL7 may be changed into the fifth to eighth write data transmitted through the fifth to eighth switching units SW04 to SW07, and the first to fourth write data loaded in the first to fourth bit lines BL0 to BL3 may be retained as they are.

Then, the memory block 210 may store the first to fourth write data loaded in the first to fourth bit lines BL0 to BL3, and store the fifth to eighth write data loaded in the fifth to eighth bit lines BL4 to BL7.

Then, a read operation RD1 may be performed.

During the read operation RD1 the first to fourth write data loaded in the first to fourth bit lines BL0 to BL3 may be properly read as first to fourth read data.

In short, the method of driving the semiconductor device 200 may include setting the data bandwidth option mode to the X4 mode and sequentially performing the first and second write operations WT1 and WT2 based on the X4 mode, when the first active operation ACT1 is performed. During the first write operation WT1, first to fourth write paths through which first to fourth write data are transmitted based on the X4 mode, among first to eighth write paths, may be electrically coupled, and the other fifth to eighth write paths may be electrically disconnected. During the second write operation WT2, the fifth to eighth write paths through which fifth to eighth write data are transmitted based on the X4 mode, among the first to eighth write paths, may be electrically coupled, and the other first to fourth write paths may be electrically disconnected.

In accordance with the embodiments of the present invention, although data are controlled on the basis of a plurality of write paths (for example, first to eight write paths) corresponding to the maximum data bandwidth option mode (for example, X8 mode) per column select signal, parts of the write paths through which write data are not substantially transmitted during the lower level option mode (for example, X4 mode) other than the maximum data bandwidth option mode may be electrically disconnected to prevent an X4 flipping error.

In accordance with the embodiments of the present invention, as X4 flipping errors are prevented, it is possible to improve operation reliability during a write or read operation.

Although various embodiments have been described for illustrative purposes, it will be apparent to those skilled in the art that various changes and modifications may be made without departing from the spirit and scope of the invention as defined in the following claims.

What is claimed:
1. A semiconductor device comprising:
   a common coupling block suitable for coupling a plurality of first data lines to a plurality of second data lines in response to a common control signal, which is activated regardless of a data bandwidth option mode;
   a first coupling block suitable for coupling a part of the plurality of second data lines to a part of a plurality of third data lines in response to a first operation control signal;
   a second coupling block suitable for coupling a other part of the plurality of second data lines to a other part of the plurality of third data lines in response to a second operation control signal; and
   a control block suitable for activating one or more of the first and second operation control signals based on the data bandwidth option mode, during a data input/output operation.
2. The semiconductor device of claim 1, wherein the plurality of third data lines have greater parasitic capacitance than the plurality of second data lines.
3. The semiconductor device of claim, wherein the common coupling block comprises:
   a plurality of first switching units simultaneously controlled by the common control signal.
4. The semiconductor device of claim 1, wherein the first coupling block comprises:
   a plurality of second switching units simultaneously controlled by the first operation control signal.
5. The semiconductor device of claim 1, wherein the second coupling block comprises:
   a plurality of third switching units simultaneously controlled by the second operation control signal.
6. The semiconductor device of claim 1, wherein the control block comprises:
   a first logic unit suitable for generating first and second control signals in response to a specific address signal and a data bandwidth option signal corresponding to the data bandwidth option mode; and
   a second logic unit suitable for generating the first and second operation control signals in response to the first and second control signals and an enable signal corresponding to the data input/output operation.
7. The semiconductor device of claim 1, further comprising:

a data storage block coupled to the plurality of first data lines; and
   a data driving block coupled to the plurality of third data lines.
8. The semiconductor device of claim 7, wherein the data driving block comprises:
   a first data driving unit coupled to the part of the third data lines; and
   a second data driving unit coupled to the other part of the third data lines,
   wherein one or more of the first and second data driving units are enabled based on a data bandwidth option signal corresponding to the data bandwidth option mode during the data input/output operation.
9. A semiconductor device comprising:
   a memory block;
   a plurality of bit lines coupled to the memory block;
   a plurality of segment lines coupled one-to-one to the plurality of bit lines;
   a common coupling block suitable for coupling the plurality of bit lines to the plurality of segment lines, at the same time, ire response to a column select signal;
   a plurality of local lines coupled one-to-one to the plurality of segment lines;
   a first coupling block suitable or coupling a part of the plurality of segment lines to a part of the plurality of local lines at the same time in response to a first operation control signal;
   a second coupling block suitable for coupling the other part of the plurality of segment lines to the other part of the plurality of local lines, at the same time, in response to a second operation control signal;
   a data driving block coupled to the plurality of local lines; and
   a control block suitable for activating one or more of the first and second operation control signals based on a data bandwidth option signal, during a column operation.
10. The semiconductor device of claim 9, wherein the plurality of local lines have greater parasitic capacitance than the plurality of segment lines.
11. The semiconductor device of claim 9, wherein the common coupling block comprises
    a plurality of first switching units simultaneously controlled by the column select signal.
12. The semiconductor device of claim 9, wherein the first coupling block comprises:
    a plurality of second switching units simultaneously controlled by the first operation control signal.
13. The semiconductor device of claim 9, wherein the second coupling block comprises:
    a plurality of third switching units simultaneously controlled by the second operation control signal.
14. The semiconductor device of claim 9, wherein the data driving block comprises:
    a first data driving unit coupled to the part of the plurality of local lines; and
    a second data driving unit coupled to the other part of the plurality of local lines,
    wherein one or more of the first and second data driving units are enabled based on the data bandwidth option signal during the column operation.
15. The semiconductor device of claim 9, wherein the control block comprises:
    a first logic unit suitable for generating first and second control signals in response to a specific address signal and the data bandwidth option signal; and a second logic unit suitable for generating the first and second operation control signals in response to the first and second control signals and an enable signal related to the column operation.

16. The semiconductor device of claim 9, further comprising:
an amplification block suitable for amplifying data loaded in the plurality of bit lines during an active operation which is performed before the column operation.

17. The semiconductor device of claim f wherein the column operation comprises a write operation.

18. A method of driving a semiconductor device, comprising:
setting a first bandwidth option mode corresponding to a data bandwidth having a lower level than a maximum data bandwidth, among a plurality of data bandwidth option modes supported by the semiconductor device; and
sequentially performing first and second write operations based on the first data bandwidth option mode, when a first active operation is performed,
wherein the performing each of the first and second write operations comprises:
connecting write paths through which data having the lower level data bandwidth are transmitted based on the first bandwidth option mode, among a plurality of write paths corresponding to the maximum data bandwidth; and
disconnecting the other write paths among the plurality of write paths.

19. The method of claim 18, wherein the plurality of rite paths each include a bit line, a segment line, and a local line, wherein the connecting of the write paths comprises:
electrically coupling bit lines and segment lines of the write paths based on a column select signal; and
electrically coupling the segment lines and local lines of the write paths based on a first switching select signal.

20. The method of claim 19, wherein the disconnecting of the other write paths comprises:
electrically coupling bit lines and segment lines of the other write paths based on a column select signal; and
electrically decoupling the segment lines from local lines of the write paths based on a second switching select signal.

* * * * *